United States Patent
Hsihe et al.

(10) Patent No.: US 8,493,700 B2
(45) Date of Patent: *Jul. 23, 2013

(54) ESD PROTECTION FOR HIGH-VOLTAGE-TOLERANCE OPEN-DRAIN OUTPUT PAD

(75) Inventors: Wu-Tsung Hsihe, Hsinchu (TW); Ming-Chun Chou, Taipei County (TW); Ming-Dou Ker, Hsinchu County (TW)

(73) Assignee: Elan Microelectronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/286,308

(22) Filed: Nov. 1, 2011

(65) Prior Publication Data

US 2012/0044605 A1    Feb. 23, 2012

Related U.S. Application Data

(63) Continuation of application No. 12/320,224, filed on Jan. 22, 2009, now Pat. No. 8,164,870.

(30) Foreign Application Priority Data

Feb. 27, 2008    (TW) ................ 97106837 A

(51) Int. Cl.
*H02H 9/00*    (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| 6,465,768 B1 * | 10/2002 | Ker et al. ................ 250/214.1 |
| 7,876,540 B2 * | 1/2011 | Deval et al. ................... 361/56 |
| 2011/0255201 A1 * | 10/2011 | Shimomura et al. ............ 361/56 |

* cited by examiner

*Primary Examiner* — Rexford Barnie
*Assistant Examiner* — Angela Brooks
(74) *Attorney, Agent, or Firm* — Muncy, Geissler, Olds & Lowe, PLLC

(57) ABSTRACT

A high-voltage NMOS transistor for ESD protection is coupled between a high-voltage I/O pad and a low-voltage terminal, and has a parasitic component between its source and drain. A trigger has an input coupled to the high-voltage I/O pad and an output coupled to the parasitic component. When the voltage on the high-voltage I/O pad raises above a threshold value, the trigger applies a voltage to trigger the parasitic component, so as to release an ESD current from the high-voltage I/O pad to the low-voltage terminal through the high-voltage NMOS transistor.

8 Claims, 6 Drawing Sheets

US 8,493,700 B2

ESD PROTECTION FOR HIGH-VOLTAGE-TOLERANCE OPEN-DRAIN OUTPUT PAD

RELATED APPLICATIONS

This application is a Continuation patent application of co-pending application Ser. No. 12/320,224, filed on 22 Jan. 2009, now pending. The entire disclosure of the prior application, Ser. No. 12/320,224, from which an oath or declaration is supplied, is considered a part of the disclosure of the accompanying Continuation application and is hereby incorporated by reference.

FIELD OF THE INVENTION

The present invention is related generally to ESD protection mechanism and, more particularly, to an ESD protection arrangement for a high-voltage input/output (I/O) pad.

BACKGROUND OF THE INVENTION

Electrostatic discharge (ESD) is the main factor that causes electronic components or systems to get damaged by electrical overstress (EOS). Such damage can affect the circuit functions of integrated circuits (ICs) and lead to abnormal operation of the ICs. In order to prevent ICs from adverse ESD effects, an ESD protection arrangement is disposed for the input/output (I/O) pads of ICs to prevent ESD from damaging the ICs. However, for high-voltage I/O pads, it is required in circuit design no PMOS components to connect to the power supply for the pads to sustain voltages higher than the supply voltage, and thereby it is difficult to improve the ESD protection capability of high-voltage I/O pads.

Therefore, an ESD protection arrangement different from the conventional high-voltage I/O pads is desired.

SUMMARY OF THE INVENTION

An objective of the present invention is to provide an ESD protection arrangement for a high-voltage I/O pad, which uses a parasitic component in an NMOS transistor for ESD protection.

Another objective of the present invention is to provide an ESD protection arrangement for a high-voltage I/O pad, which enables the high-voltage I/O pad to have an open-drain output capability.

Still another objective of the present invention is to provide an ESD protection arrangement for a high-voltage I/O pad, which prevents the ESD protection mechanism from false triggering during normal operation.

According to the present invention, an ESD protection arrangement for a high-voltage I/O pad includes a high-voltage NMOS transistor coupled between the high-voltage I/O pad and a low-voltage terminal, and a trigger coupled to the high-voltage I/O pad and a parasitic component between a source and a drain of the high-voltage NMOS transistor. The trigger monitors the voltage on the high-voltage I/O pad and triggers the parasitic component when the voltage on the high-voltage I/O pad raises above a threshold value during an ESD event, to release an ESD current from the high-voltage I/O pad through the parasitic component to the low-voltage terminal for ESD protection. Preferably, an open-drain output controller is coupled to the high-voltage NMOS transistor to switch thereto, in order for the high-voltage I/O pad to have an open-drain output capability. Preferably, an error prevented circuit is coupled to the parasitic component to prevent therefrom false triggering during normal operation.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
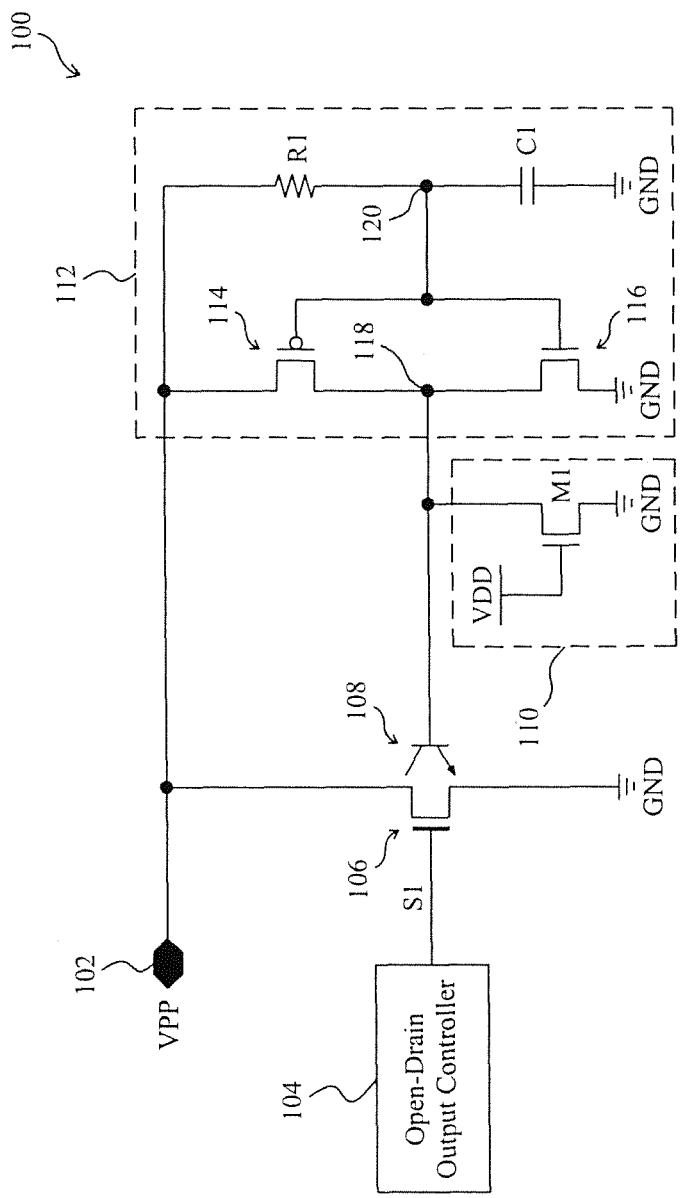
FIG. 1 is a circuit diagram of a first embodiment according to the present invention.

FIG. 1 shows a first embodiment according to the present invention. In an ESD protection arrangement 100, a high-voltage NMOS transistor 106 is coupled between a high-voltage I/O pad 102 and a ground terminal GND, the high-voltage NMOS transistor 106 has a parasitic NPN bipolar junction transistor (BJT) 108 between its source and drain, and a trigger 112 has an input coupled to the high-voltage I/O pad 102 and an output 118 coupled to the base of the parasitic BJT 108. The trigger 112 monitors the voltage VPP on the high-voltage I/O pad 102 and, when the voltage VPP raises above a threshold value, triggers the parasitic BJT 108 to release an ESD current from the high-voltage I/O pad 102 to the ground terminal GND for ESD protection. In this embodiment, the trigger 112 is an inverter trigger and includes a PMOS transistor 114 coupled between the high-voltage I/O pad 102 and the output 118, an NMOS transistor 116 coupled between the output 118 and the ground terminal GND, a resistor R1 coupled between the high-voltage I/O pad 102 and a node 120, and a capacitor C1 coupled between the node 120 and the ground GND. The output 118 is coupled to the base of the parasitic BJT 108, and the voltage on the node 120 is applied to the gates of the PMOS transistor 114 and the NMOS transistor 116 to switch thereto, so as to couple the high-voltage I/O pad 102 or the ground terminal GND to the base of the parasitic BJT 108. During ESD events, the voltage on the node 120 has an initial value of zero, so that the PMOS transistor 114 is turned on and the NMOS transistor 116 is turned off. When the voltage VPP on the high-voltage I/O pad 102 increases, the voltage on the node 120 will not be instantly pulled up to a high level due to the RC delay of the serially coupled resistor R1 and capacitor C1, and the PMOS transistor 114 remains on to couple the high-voltage I/O pad 102 to the base of the parasitic BJT 108. Once the voltage VPP on the high-voltage I/O pad 102 raises above a threshold value and thus turns on the parasitic BJT 108, an ESD current is induced to flow from the high-voltage I/O pad 102 to the ground terminal GND through the parasitic BJT 108.

In the ESD protection arrangement 100, an open-drain output controller 104 is coupled to the gate of the high-voltage NMOS transistor 106 to apply a control signal Si thereto, so as to switch the high-voltage NMOS transistor 106. When the high-voltage NMOS transistor 106 is turned on, the high-voltage I/O pad 102 will be coupled to the ground terminal GND, and thus the voltage VPP on the high-voltage I/O pad 102 will be pulled down to a low level. After the high-voltage NMOS transistor 106 is turned off, the voltage VPP on the high-voltage I/O pad 102 will be pulled back to the high level of the external voltage applied thereto (not shown in this figure). Therefore, the voltage VPP on the high-voltage I/O pad 102 will change when the open-drain output controller 104 switches the high-voltage NMOS transistor 106. As a result, in addition to be used as a high-voltage sustaining input pad, the high-voltage I/O pad 102 can be used as an open-drain output pad. Preferably, an error prevented circuit 110 is coupled to the base of the parasitic BJT 108 to prevent unintentional triggering of the ESD protection mechanism during normal operation, which includes a NMOS transistor M1 coupled between the base of the parasitic BJT 108 and the ground terminal GND, and biased by a supply voltage VDD. During ESD events, the supply voltage VDD is zero, so that the NMOS transistor M1 is turn off and the ESD protection capability is not affected. During normal operation, the supply voltage VDD turns on the NMOS transistor M1 to ground the base of the parasitic BJT 108, which prevents the parasitic BJT 108 from being turned on and thereby prevents the ESD protection mechanism from being unintentional triggered.

Figure 2:
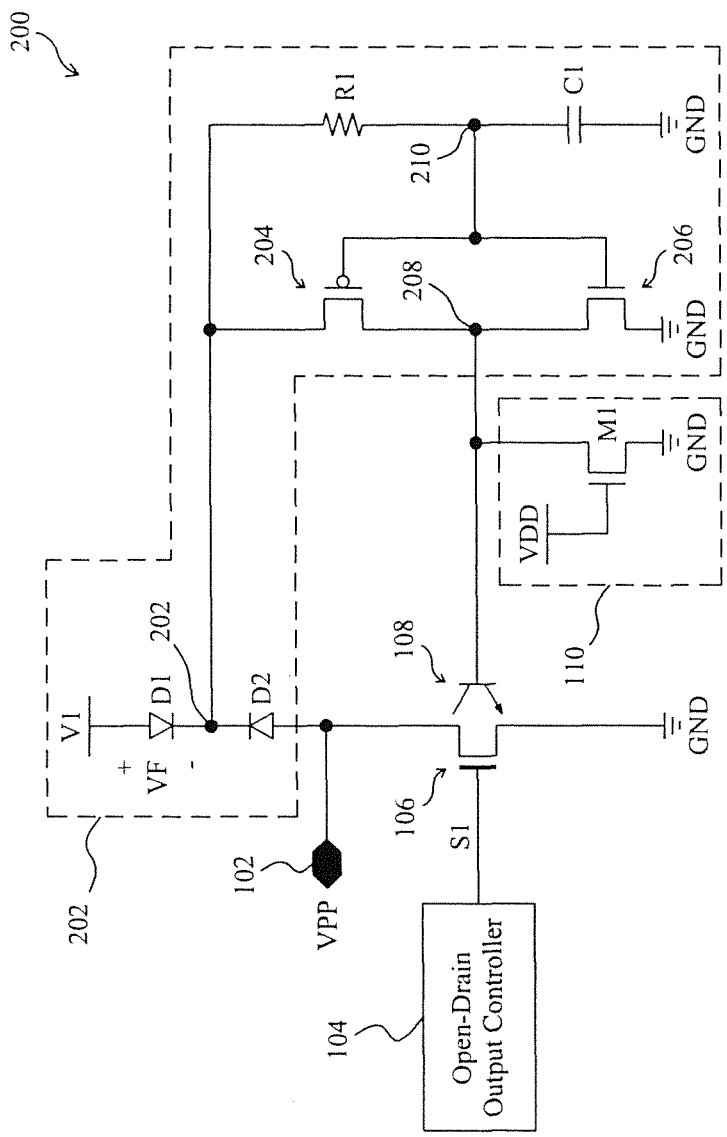
FIG. 2 is a circuit diagram of a second embodiment according to the present invention.

FIG. 2 shows a second embodiment according to the present invention. In an ESD protection arrangement 200, an inverter trigger 202 has an input coupled to the high-voltage I/O pad 102 and an output 208 coupled to the base of the parasitic BJT 108. The inverter trigger 202 monitors the voltage VPP on the high-voltage I/O pad 102 and, when the voltage VPP raises above a threshold value, triggers the parasitic BJT 108 to release an ESD current from the high-voltage I/O pad 102 to the ground terminal GND for ESD protection. In the inverter trigger 202, two diodes D1 and D2 are face-to-face coupled by a node 202 between a bias voltage input V1 and the high-voltage I/O pad 102, a PMOS transistor 204 is coupled between the node 202 and the output 208, an NMOS transistor 206 is coupled between the output 208 and the ground terminal GND, a resistor R1 is coupled between the node 202 and a node 210, and a capacitor C1 is coupled between the node 210 and the ground terminal GND. The output 208 is coupled to the base of the parasitic BJT 108, and the voltage on the node 210 is applied to the gates of the PMOS transistor 204 and the NMOS transistor 206 to switch thereto, so as to couple the node 202 or the ground terminal GND to the base of the parasitic BJT 108. During ESD events, the voltage on the node 210 is initially V1-VF, where VF is the forward voltage of the diode D1, and therefore, the inverter trigger 202 requires a higher voltage VPP on the high-voltage I/O pad 102 in order to turn on the parasitic BJT 108 as compared with that of the inverter trigger 112 in the circuit of FIG. 1. In this embodiment, the open-drain output controller 104 to switch the high-voltage NMOS transistor 106 to empower the high-voltage I/O pad 102 to have an open-drain output capability, and the error prevented circuit 110 to prevent the ESD protection mechanism from being unintentional triggered during normal operation are the same as those in the circuit of FIG. 1.

Figure 3:
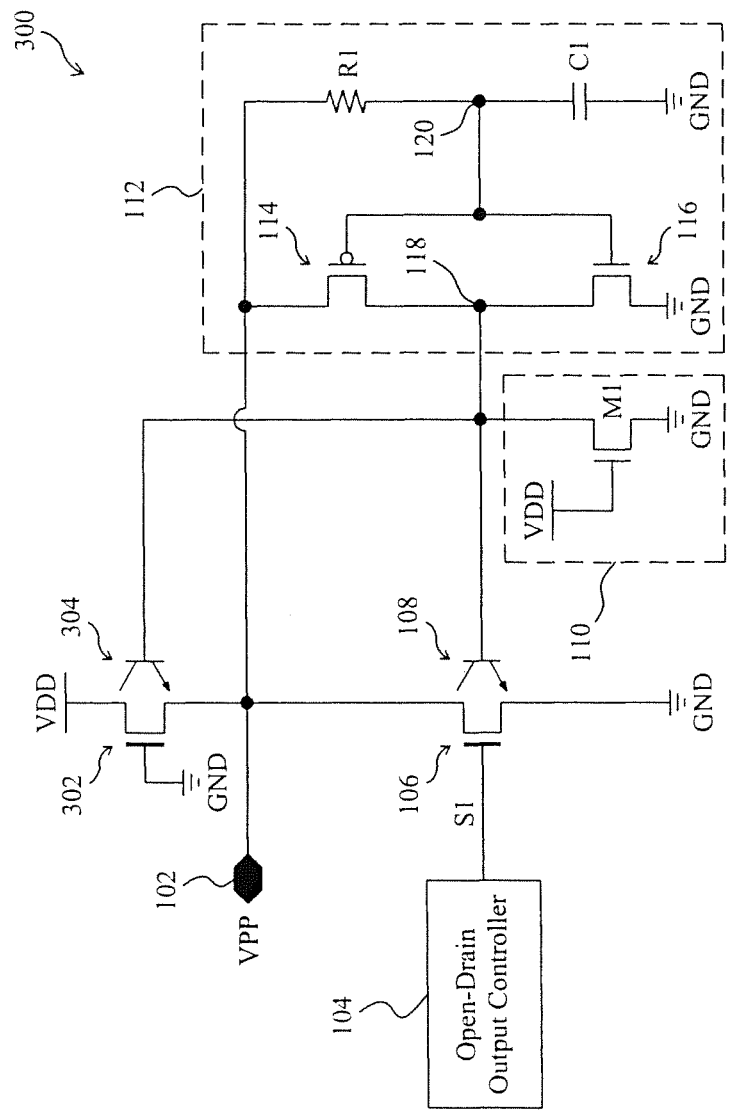
FIG. 3 is a circuit diagram of a third embodiment according to the present invention.

FIG. 3 shows a third embodiment according to the present invention. The high-voltage NMOS transistor 106, the parasitic BJT 108, the inverter trigger 112, the open-drain output controller 104, and the error prevented circuit 110 are all the same as those in the circuit of FIG. 1. The ESD protection arrangement 300 in this embodiment further includes a second high-voltage NMOS transistor 302 coupled between a voltage input VDD and the high-voltage I/O pad 102, whose gate is grounded. The second high-voltage NMOS transistor 302 also has a parasitic NPN BJT 304 whose base is also coupled to the output of the inverter trigger 112. During ESD events, once the voltage VPP on the high-voltage I/O pad 102 raises above a threshold value, the inverter trigger 112 will turn on the parasitic BJTs 108 and 304, to release ESD currents from the high-voltage I/O pad 102 to the ground terminal GND and the voltage input VDD for ESD protection.

Figure 4:
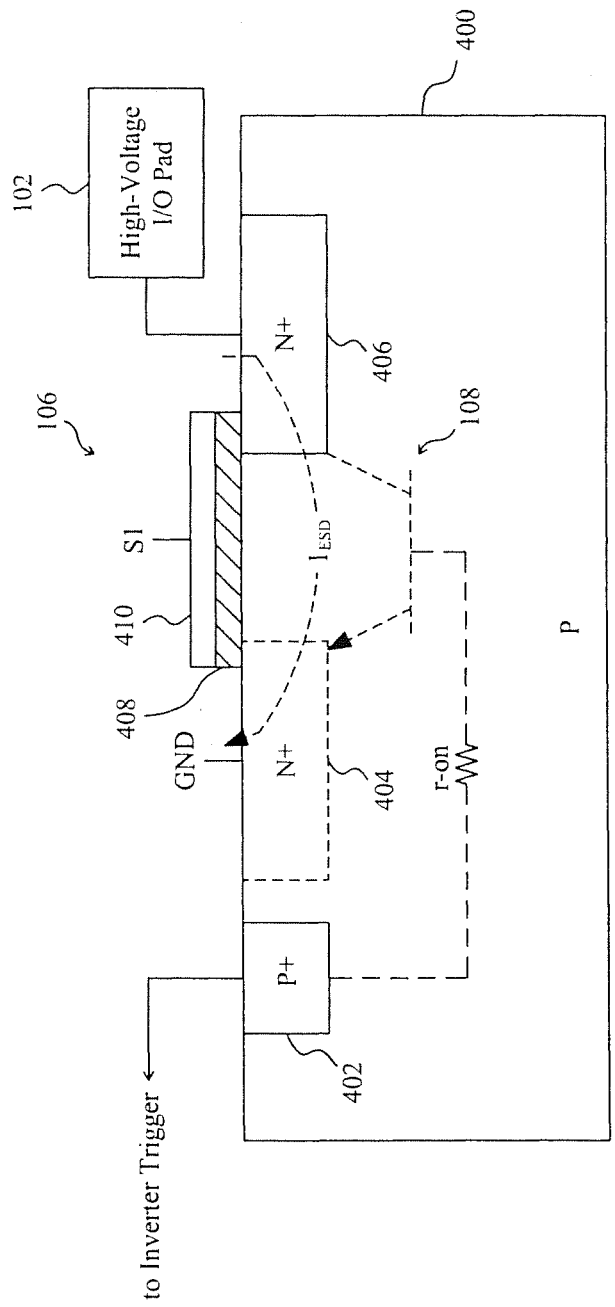
FIG. 4 is a diagram showing a semiconductor structure of the high-voltage NMOS transistor for the ESD protection arrangement according to the present invention.

FIG. 4 shows a semiconductor structure of the high-voltage NMOS transistor 106 for the ESD protection arrangement according to the present invention, which includes a p-type substrate 400, a p-type region 402 on the p-type substrate 400 to couple to the output of the inverter trigger, n-type regions 404 and 406 on the p-type substrate 400 are the drain and the source of the high-voltage NMOS transistor 106 and coupled to the ground terminal GND and the high-voltage I/O pad 102 respectively, and a gate compose of an oxide layer 408 on the p-type substrate 400 and between the n-type regions 404 and 406, and a metal layer 410 on the oxide layer 408 and coupled to the output Si of the open-drain output controller 104. In this structure, the parasitic NPN BJT 108 is formed from the p-type substrate 400 and the n-type regions 404 and 406. When the voltage VPP on the high-voltage I/O pad 102 raises above a threshold value, the output of the inverter trigger will turn on the parasitic BJT 108. In other words, a channel will present between the n-type regions 404 and 406, so as to release an ESD current $I_{ESD}$ from the high-voltage I/O pad 102, through the n-type region 406, the p-type substrate 400 and the n-type region 404, to the ground terminal GND.

Figure 5:
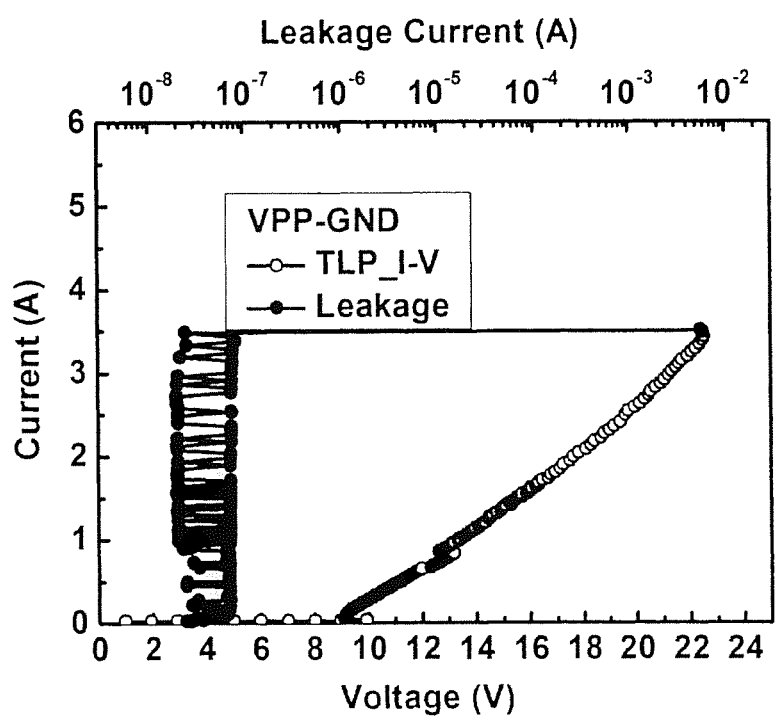
FIG. 5 is a diagram showing the I-V curve of the high-voltage I/O pad in the circuit of FIG. 1 according to an actual measurement.
Figure 6:
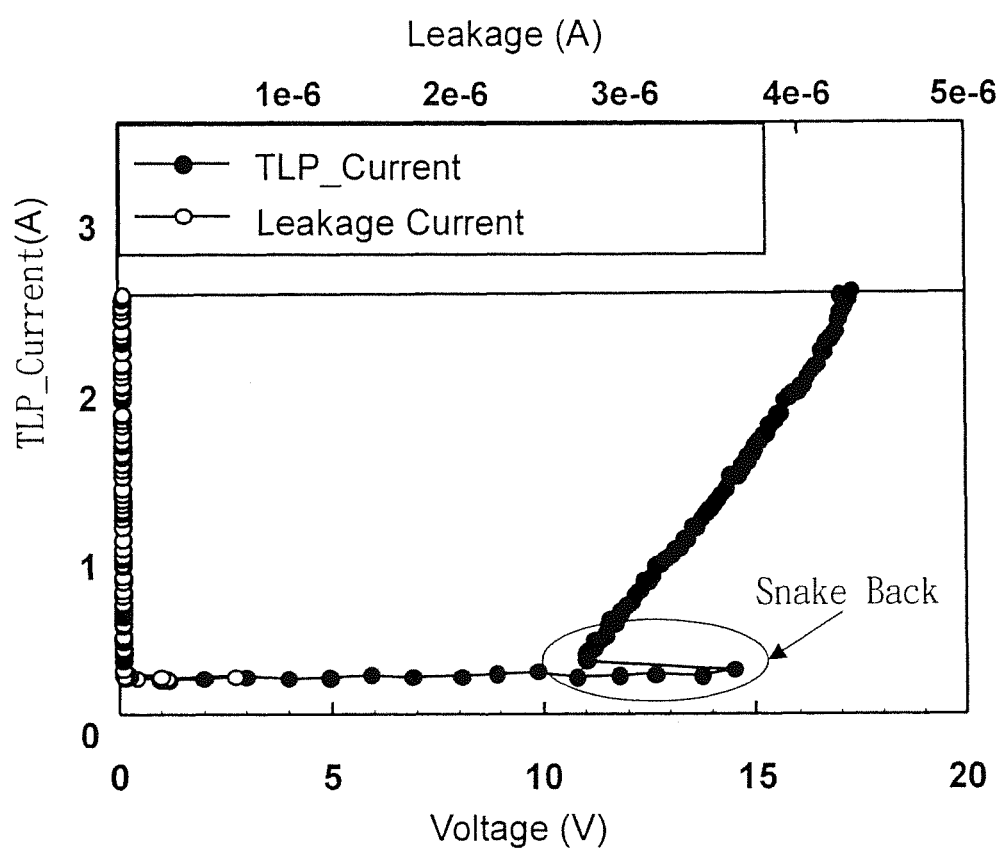
FIG. 6 is a diagram showing the I-V curve of a high-voltage I/O pad without the ESD protection arrangement of FIG. 1 according to an actual measurement.

FIG. 5 is a diagram showing the current versus the voltage between the high-voltage I/O pad 102 and the ground terminal GND in the circuit of FIG. 1 according to an actual measurement. FIG. 6 is a diagram showing the current versus the voltage between a high-voltage I/O pad and a ground terminal without the ESD protection arrangement 100 of FIG. 1. As can be observed from the I-V curves of FIGS. 5 and 6, the ESD protection arrangement 100 eliminates the snake back phenomenon and is thus evidenced to have an excellent ESD protection capability.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An ESD protection arrangement for a high-voltage I/O pad, comprising:
a high-voltage NMOS transistor coupled between said high-voltage I/O pad and a low-voltage terminal, said high-voltage NMOS transistor having a parasitic component between a source and a drain thereof; and
a trigger coupled to said high-voltage I/O pad and said parasitic component, to monitor the voltage on said high-voltage I/O pad in order to trigger said parasitic component when the voltage on said high-voltage I/O pad raises above a threshold value during an ESD event, so as to release an ESD current therethrough from said high-voltage I/O pad to said low-voltage terminal; and
a controller coupled to said high-voltage NMOS transistor to apply a control signal thereto, to switch said high-voltage NMOS transistor in order for said high-voltage I/O pad to have an open-drain output capability.

2. The ESD protection arrangement of claim 1, wherein said parasitic component comprises an NPN BJT.

3. The ESD protection arrangement of claim 1, wherein said trigger comprises an inverter trigger coupled to said parasitic component, to trigger said parasitic component.

4. The ESD protection arrangement of claim 3, wherein said trigger further comprises:
   a first transistor coupled between said high-voltage I/O pad and said parasitic component; and
   a second transistor between said parasitic component and said low-voltage terminal;
   wherein said first and second transistors are switched by a voltage, so as to couple said high-voltage I/O pad or said low-voltage terminal to said parasitic component.

5. The ESD protection arrangement of claim 1, further comprising an error prevented circuit coupled to said parasitic component, to prevent said parasitic component from being triggered during normal operation, wherein said error prevented circuit comprises:
   a switch coupled between said parasitic component and said low-voltage terminal; and
   a voltage source coupled to said switch, to switch said switch.

6. The ESD protection arrangement of claim 1, further comprising a second high-voltage NMOS transistor coupled between a voltage input and said high-voltage I/O pad, wherein said second high-voltage NMOS transistor has a second parasitic component between a source and a drain thereof, coupled to said trigger, and triggered by said trigger when the voltage on said high-voltage I/O pad raises above said threshold value, to release a second ESD current from said high-voltage I/O pad to said voltage input.

7. An ESD protection arrangement for a high-voltage I/O pad, comprising:
   a semiconductor structure formed on a substrate, including:
      a first region of a first conductive type;
      a second region of said first conductive type on said first region; and
      a third region of a second conductive type on said first region and coupled to a low-voltage terminal;
      a fourth region of said second conductive type on said first region and coupled to said high-voltage I/O pad;
      an oxide layer on said first region and between said third and fourth regions; and
      a metal layer on said oxide layer;
   a trigger coupled to said second region, to apply a voltage thereto; and
   a controller coupled to said metal layer to apply a control signal thereto, to switch a high-voltage NMOS transistor in order for said high-voltage I/O pad to have an open-drain output capability;
   wherein said first, third and fourth regions and said oxide and metal layers constitute said high-voltage NMOS transistor, and said first, second, third and fourth regions constitute a parasitic BJT to be triggered when the voltage on said high-voltage I/O pad raises above a threshold value during an ESD event, so as to release an ESD current from said high-voltage I/O pad to said low-voltage terminal through said fourth, first and third regions.

8. The ESD protection arrangement of claim 7, wherein said trigger comprises an inverter trigger coupled to said second region, to couple said high-voltage I/O pad or said low-voltage terminal thereto.

* * * * *